(12) United States Patent
Nakayama

(10) Patent No.: US 10,184,960 B2
(45) Date of Patent: Jan. 22, 2019

(54) CURRENT SENSOR

(71) Applicant: TOYOTA JIDOSHA KABUSHIKI KAISHA, Toyota-shi, Aichi (JP)

(72) Inventor: Wataru Nakayama, Toyota (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 0 days.

(21) Appl. No.: 15/550,063

(22) PCT Filed: Mar. 10, 2016

(86) PCT No.: PCT/JP2016/057658
§ 371 (c)(1),
(2) Date: Aug. 10, 2017

(87) PCT Pub. No.: WO2016/148032
PCT Pub. Date: Sep. 22, 2016

(65) Prior Publication Data
US 2018/0031613 A1 Feb. 1, 2018

(30) Foreign Application Priority Data
Mar. 18, 2015 (JP) ................. 2015-054256

(51) Int. Cl.
*G01R 15/18* (2006.01)
*G01R 15/20* (2006.01)
(Continued)

(52) U.S. Cl.
CPC ............ *G01R 15/207* (2013.01); *G01R 1/18* (2013.01); *G01R 15/205* (2013.01); *G01R 19/25* (2013.01);
(Continued)

(58) Field of Classification Search
CPC ........ G01R 15/18; G01R 15/20; G01R 19/25; G01R 33/03; G01R 33/05; G01R 33/07; G01R 33/09
See application file for complete search history.

(56) References Cited

U.S. PATENT DOCUMENTS

2010/0148766 A1 6/2010 Weischedel
2016/0258985 A1* 9/2016 Nomura ................. G01R 33/09

FOREIGN PATENT DOCUMENTS

DE 102008034577 A1 2/2010
JP 2013-117447 A 6/2013
WO 2012046547 A1 4/2012

OTHER PUBLICATIONS

International Search Report for PCT/JP2016/057658 dated Jun. 7, 2016.

* cited by examiner

*Primary Examiner* — Neel Shah
(74) *Attorney, Agent, or Firm* — Sughrue Mion, PLLC

(57) ABSTRACT

A current sensor is configured to measure current flowing in two bus bars aligned in an X direction and extending parallel in a Y direction. A sensing element is arranged such that its magnetism sensing direction is oriented in the X direction on a line passing through the bus bar in a Z direction. A pair of shield plates sandwiches the bus bar and the sensing element therebetween in the Z direction. The bus bar is located between the sensing element and the lower shield plate. The sensing element is located closer to the upper shield plate than to the lower shield plate. At least one of a thickness and a magnetic permeability of the magnetism shield plates is greater in the upper shield plate than in the lower shield plate.

4 Claims, 13 Drawing Sheets

(51) Int. Cl.
  *G01R 19/25*    (2006.01)
  *G01R 33/05*    (2006.01)
  *G01R 33/07*    (2006.01)
  *G01R 33/09*    (2006.01)
  *G01R 1/18*     (2006.01)
  *G01R 19/00*        (2006.01)
(52) U.S. Cl.
  CPC ........... *G01R 33/05* (2013.01); *G01R 33/093* (2013.01); *G01R 15/202* (2013.01); *G01R 19/0092* (2013.01)

CURRENT SENSOR

CROSS REFERENCE TO RELATED APPLICATIONS

This application is a National Stage of International Application No. PCT/JP2016/057658 filed Mar. 10, 2016, claiming priority based on Japanese Patent Application No. 2015-054256 filed Mar. 18, 2015, the contents of all of which are incorporated herein by reference in their entirety.

TECHNICAL FIELD

The technique disclosed herein relates to a current sensor. Especially, the technique disclosed herein relates to a current sensor configured to measure a current flowing in one of two conductors extending in parallel.

BACKGROUND ART

A current sensor utilizing a magnetoelectric transducer is known. The magnetoelectric transducer measures an intensity of a magnetic field generated by a current flowing in a conductor. A unique relationship resides between a magnitude of the current flowing in the conductor and the generated magnetic field. The current sensor uses this relationship to specify a magnitude of the current flowing in the conductor from the intensity of the magnetic field measured by the magnetoelectric transducer.

When a magnetic field other than that generated by the measurement target conductor is sensed by the magnetoelectric transducer, measurement accuracy of the current decreases. Hereinbelow, a magnetic field other than the "magnetic field generated by the measurement target conductor" will be termed "noise magnetic field". The magnetoelectric transducer and the conductor are proposed to be arranged between a pair of magnetism shield plates so as to shield the magnetoelectric transducer from the noise magnetic field. Japanese Patent Application Publication No. 2013-117447 (hereinbelow, Patent Document 1) discloses an example of such a current sensor.

Patent Document 1 points out the following features. As a result of the noise magnetic field being absorbed by the pair of magnetism shield plates, magnetic flux flows in the respective magnetism shield plates, and a magnetic field is generated between the pair of magnetism shield plates. If the magnetoelectric transducer senses the magnetic field generated between the pair of magnetism shield plates, current measurement accuracy is reduced. Patent Document 1 also proposes a technique for reducing an influence of the magnetic field generated between the pair of magnetism shield plates due to the noise magnetic field.

Here, for the sake of explanation, a coordinate system will be defined. A direction along which a conductor extends will be defined as a Y direction, and two directions orthogonal to the direction along which the conductor extends will respectively be defined as an X direction and a Z direction. A direction along which the conductor and the magnetoelectric transducer are aligned will be defined as the Z direction. The denotations of the X direction, the Y direction, and the Z direction may more generally be termed a first direction, a second direction, and a third direction, respectively. Further, for the sake of explanation, a magnetic field that a measurement target generates will be termed a measuring magnetic field. A magnetic field generated between a pair of magnetism shield plates due to the noise magnetic field will be termed an inter-shield magnetic field. Further, the magnetism shield plates may simply be termed shield plates.

The magnetoelectric transducer senses a magnetic field along a certain direction (magnetism sensing direction). The magnetoelectric transducer does not sense magnetic fields along directions orthogonal to the magnetism sensing direction. A magnetic field generated by a conductor extends in a circular shape with the conductor at a center. If a cross section of the conductor is rectangular, the magnetic field generated by the conductor extends in an ellipsoidal shape with the conductor at the center. The conductor extends in the Y-axis direction, and the magnetoelectric transducer is aligned with the conductor in the Z direction. Thus, the measuring magnetic field penetrates the magnetoelectric transducer in the X direction. Due to this, the magnetoelectric transducer is arranged such that its magnetism sensing direction is oriented in the X direction so that the measuring magnetic field and the magnetism sensing direction match each other. Further, a pair of shield plates sandwiches the magnetoelectric transducer and the conductor in the Z direction.

Now returning to the explanation of the technique for reducing the influence of the inter-shield magnetic field disclosed in Patent Document 1, the magnetoelectric transducer in Patent Document 1 is attached to a surface of a sensor substrate. The magnetism sensing direction is oriented in a direction parallel to the surface of the sensor substrate. The sensor substrate is arranged such that the surface on which the magnetoelectric transducer is attached faces the conductor. This surface of the sensor substrate is orthogonal to the Z direction, and the magnetism sensing direction matches the X direction. The pair of shield plates is arranged such that lines formed by facing surfaces (inner surfaces) of the pair of shield plates in a cross section cut along a plane formed by the X axis and the Z axis are line-symmetric relative to a particular line (reference line). The reference line may be termed a symmetric axis. The pair of shield plates is arranged such that their symmetric axis is in contact with the aforementioned surface of the sensor substrate while extending in the X direction. The inter-shield magnetic field (its magnetic flux lines) extends in a curved shape oriented from one of the shield plates to the other of the shield plates, and as such, the inter-shield magnetic field exhibits symmetry relative to the symmetric axis due to the aforementioned arrangement of the pair of shield plates. Thus, an orientation of the inter-shield magnetic field becomes orthogonal to the symmetric axis. On the other hand, the magnetism sensing direction of the magnetoelectric transducer matches the X direction, that is, the direction of the symmetric axis. The direction of the inter-shield magnetic field comes to be orthogonal to the magnetism sensing direction. As a result of this, the influence imposed on the magnetoelectric transducer by the inter-shield magnetic field is thereby suppressed.

SUMMARY OF INVENTION

Technical Problem

The technique of Patent Document 1 is, in other words, a technique in which the pair of shield plates is arranged so that the facing surfaces of the pair of shield plates become line-symmetric in the cross section cut along the XZ plane, and the magnetoelectric transducer is arranged on this symmetric axis. By employing such an arrangement, an interval A for arranging the conductor between the magnetoelectric transducer and one of the shield plates becomes necessary, and in addition, another interval A needs to be provided between the magnetoelectric transducer and the other of the shield plates, despite the lack of need to arrange any components therein. In FIGS. 1 and 6 of Patent Document 1, the conductor is arranged between the magnetoelectric transducer and one of the shield plates, and a wasteful space is provided between the magnetoelectric transducer and the other of the shield plates. As mentioned earlier, the magnetic field of the shield plates extends in the curved shape oriented from one of the shield plates to the other of the shield plates. Due to this, if the wasteful space is narrowed, the symmetric axis becomes displaced from the magnetoelectric transducer, and the inter-shield magnetic field comes to exhibit a component in the magnetism sensing direction at a location of the magnetoelectric transducer. As a result of this, measurement accuracy of the current sensor is deteriorated. The disclosure herein proposes a technique that reduces such a wasteful space between a pair of shield plates and increases accuracy of a current sensor.

It should be noted that the technique of Patent Document 1 is assumed as being on a premise that magnetic fields of same intensity are to act on the pair of shield plates. Since the magnetic fields of the same intensity act on the pair of shield plates, the magnetic field that is generated between the pair of shield plates with the line-symmetric facing surfaces also becomes line-symmetric relative to the symmetric axis. It should be noted that the directions of the magnetic fields may be opposite to each other for the respective shield plates. As a situation in which the magnetic fields of the same intensity act on the pair of shield plates, a case may be assumed in which a conductor being a source of a noise magnetic field is aligned with a measurement target conductor in the X direction. For example, a case for a current sensor that measures a current of one conductor among three conductors, which extend parallel to one another, for a three-phase alternating current motor may be assumed. The remaining conductors other than the one conductor become the sources of the noise magnetic fields. The technique disclosed herein targets a current sensor that measures a current flowing in one conductor of two conductors which are aligned in the X direction (first direction) and extend in parallel in the Y direction (second direction) that is orthogonal to the X direction. In the disclosure herein, a technique is provided for reducing a wasteful space between a pair of shield plates in such a current sensor, and increasing current sensor accuracy.

Solution to Technical Problem

A structure of the current sensor disclosed herein will be expressed using the coordinate system as previously defined. The two conductors are aligned in the X direction (first direction), and extend parallel in the Y direction (second direction) orthogonal to the X direction (first direction). A magnetoelectric transducer is aligned with the one conductor in the Z direction (third direction) being orthogonal to the X direction (first direction) and the Y direction (second direction). The magnetoelectric transducer is disposed such that its magnetism sensing direction is oriented in the X direction (first direction). A pair of shield plates (pair of magnetism shield plates) sandwiches the one conductor and the magnetoelectric transducer therebetween in the Z direction (third direction).

The technique disclosed herein gives different properties to the one shield plate and the other shield plate to intentionally break line symmetry of an inter-shield magnetic field. Due to this, as compared to a case of giving a same property to the pair of shield plates, a component of the inter-shield magnetic field in the magnetism sensing direction becomes smaller at a position different from that of a symmetric axis. Findings as below have been made regarding the properties of the shield plates according to various simulations. That is, by making at least one of a thickness and a magnetic permeability of the shield plate closer to a sensing element larger than corresponding one of a thickness and a magnetic permeability of the shield plate farther away from the sensing element, the component of the inter-shield magnetic field in the magnetism sensing direction at a position of the sensing element can be made small.

In the current sensor disclosed herein, the one conductor is located between the magnetoelectric transducer and one magnetism shield plate of the pair of magnetism shield plates, and the magnetoelectric transducer is located closer to the other magnetism shield plate of the pair of magnetism shield plates than to the one magnetism shield plate. At least one of the thickness and the magnetic permeability of the other magnetism shield plate (shield plate closer to the sensing element) is larger than corresponding one of the thickness and the magnetic permeability of the one magnetism shield plate (shield plate farther away from the sensing element). By giving the thicknesses and/or magnetic permeabilities satisfying the above condition to the pair of shield plates, an influence of the inter-shield magnetic field on the magnetoelectric transducer located at a position displaced from the symmetric axis can be reduced. The technique disclosed herein improves current sensor accuracy while omitting the need to arrange the magnetoelectric transducer on the symmetric axis and reducing a wasteful space between the pair of shield plates. Detailed description including simulation results will be discussed in Embodiments below.

DESCRIPTION OF EMBODIMENTS

Figure 1:
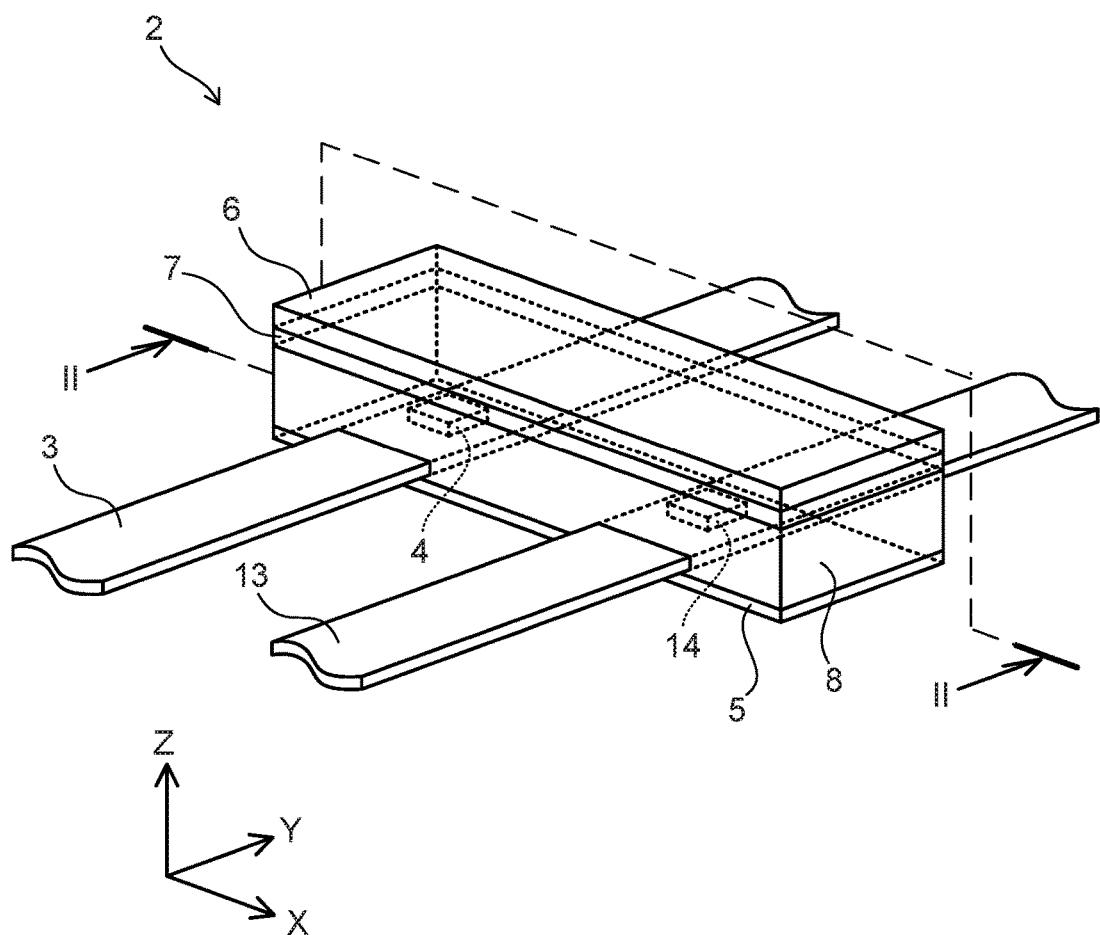
FIG. 1 is a schematic perspective view of a current sensor 2 of an embodiment.

Firstly, some of the features characteristic to below-described embodiments will herein be listed. It should be noted that the respective technical elements are independent of one another, and are useful solely or in combinations. The combinations thereof are not limited to those described in the claims as originally filed.

In a current sensor of an embodiment, a thickness Tu of an upper shield plate 6 located closer to a sensing element 4 is greater than a thickness Tl of a lower shield plate 5 farther away from the sensing element 4. Further, in a current sensor of another embodiment, a magnetic permeability Mu of the upper shield plate 6 located closer to the sensing element 4 is greater than a magnetic permeability Ml of the lower shield plate 5 farther away from the sensing element 4. In both of these cases, as compared to a case of giving a same property to the pair of shield plates 5, 6, an X direction component (component in a magnetism sensing direction) of an inter-shield magnetic field at a position of the sensing element 4 becomes smaller.

Further, in a current sensor of yet another embodiment, the thickness of the upper shield plate 6 and the thickness of the lower shield plate 5 are same. A product (Mu*Ru) of the magnetic permeability Mu of the upper shield plate 6 and a range Ru between the upper shield plate 6 and the sensing element 4 is equal to a product (Ml*Rl) of the magnetic permeability Ml of the lower shield plate 5 and a range Rl between the lower shield plate 5 and the sensing element 4. When such a relationship is satisfied, an orientation of the inter-shield magnetic field at the position of the sensing element 4 matches the Z direction. That is, the inter-shield magnetic field becomes orthogonal to a magnetism sensing direction (X direction) of the sensing element 4. Thus, current measurement accuracy is significantly improved.

Another sensing element 14 that measures a current flowing in another conductor (bus bar 13) of two conductors (bus bars 3, 13) is arranged so as to be adjacent to the other conductor (bus bar 13) in the Z direction on a same side as the sensing element 4 relative to one conductor (bus bar 3). That is, a current sensor 2 can measure the current flowing in each of the two conductors (bus bars 3, 13).

It should be noted, in denoting the one conductor (bus bar 3) as a first conductor, the other conductor (bus bar 13) as a second conductor, the lower shield plate 5 as a first shield plate, and the upper shield plate 6 as a second shield plate, the technique disclosed herein may be expressed as below. The current sensor 2 measures the current flowing in the first conductor. The first conductor is aligned with the second conductor in a first direction (X direction). The first and second conductors extend parallel in a second direction (Y direction). The magnetoelectric transducer 4 is aligned with the first conductor in the Z direction. The magnetism sensing direction of the magnetoelectric transducer 4 is oriented along the X direction. The first and second conductors and the magnetoelectric transducer 4 are sandwiched by the first and second shield plates in a third direction (Z direction). The first conductor is located between the first shield plate and the magnetoelectric transducer 5. The magnetoelectric transducer 4 is located closer to the second shield plate than to the first shield plate. The thickness of the second shield plate is larger than the thickness of the first shield plate, or alternatively the magnetic permeability of the second shield plate is larger than the magnetic permeability of the first shield plate.

Figure 2:
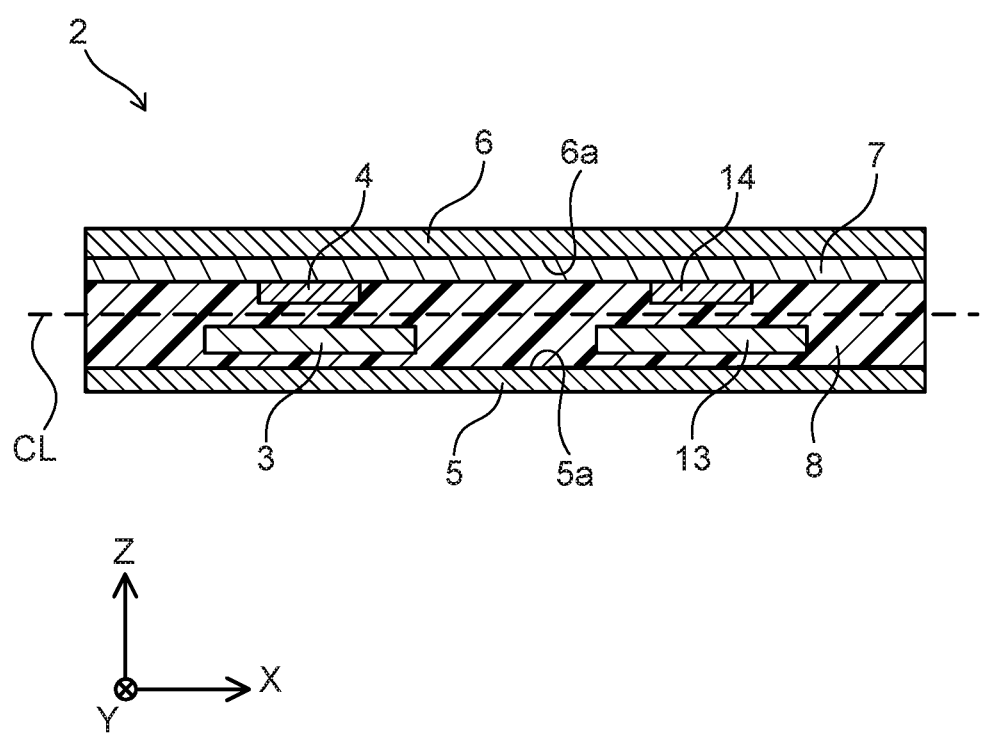
FIG. 2 is a cross sectional view of the current sensor 2 along a line II-II in FIG. 1.

A current sensor 2 of an embodiment will be described with reference to the drawings. FIG. 1 shows a schematic perspective view of the current sensor 2. FIG. 2 shows a cross sectional view of the current sensor 2 along a line II-II of FIG. 1. The current sensor 2 is a sensor capable of simultaneously measuring currents flowing respectively in two bus bars 3, 13 extending in parallel. A "bus bar" is a conductor constituted of an elongate metal plate or metal bar, and having a small resistance as compared to wire cables. The bus bar is suitable for transferring a high current. The bus bars 3, 13 and the current sensor 2 that measures the currents thereof are used, for example, inside an inverter for driving a three-phase alternating current motor in an electric vehicle. The bus bars 3, 13 are conductors transferring currents for two phases among the three-phase alternating currents, and the current sensor 2 measures the currents for the two phases among the three-phase alternating currents.

The current sensor 2 comprises a sensing element 4 arranged adjacent to the bus bar 3, a sensing element 14 arranged adjacent to the bus bar 13, a sensor substrate 7 for fixing the sensing elements 4, 14, a pair of shield plates 5, 6, and a resin package 8.

Here, for easier explanation, a coordinate system will be defined. A direction in which the bus bars 3, 13 are aligned is defined as an X direction. A direction in which the bus bars 3, 13 extend is defined as a Y direction. The X direction and the Y direction are orthogonal to each other. A direction orthogonal to both the X direction and the Y direction is defined as a Z direction. Further, for easier explanation, a positive direction of the Z axis will be expressed as "upward", and a negative direction of the Z axis will be expressed as "downward".

The two bus bars 3, 13 are aligned in the X direction, and extend parallel in the Y direction. The sensing element 4 is arranged adjacent to the bus bar 3 in the Z direction. The sensing element 4 is arranged such that a position of its center in the X direction matches a position of a center of the bus bar 3 in the X direction. The sensing element 4 measures an intensity of a magnetic field generated by the current flowing in the bus bar 3. The current flowing in the bus bar 3 and the intensity of the magnetic field generated by this current have a unique relationship therebetween. The current sensor 2 makes use of this relationship to identify a magnitude of the current flowing in the bus bar 3. The sensing element 4 is one type of magnetoelectric transducers, and is specifically a hole element.

A direction of a magnetic field that the sensing element 4 is capable of measuring is determined. The measurable direction of the magnetic field is called a magnetism sensing direction. A magnetic field is generated around the bus bar 3 due to the current flowing in the bus bar 3. This magnetic field spreads in a circular or ellipsoidal shape with the bus bar 3 as a center. The sensing element 4 is arranged adjacent to the bus bar 3 in the Z direction. The magnetic field caused by the current flowing in the bus bar 3 is oriented in the X direction at the position of the sensing element 4. Due to this, the sensing element 4 is arranged such that its magnetism sensing direction is oriented along the X direction. As aforementioned, the sensing element 4 and the bus bar 3 are at a same position in the Y direction. Thus, in other words, the sensing element 4 is arranged such that its magnetism sensing direction is oriented in the X direction on a line passing through the bus bar 3 in the Z direction.

The sensing element 14 is arranged adjacent to the bus bar 13 in the Z direction. The sensing element 14 is arranged such that a position of its center in the X direction matches a position of a center of the bus bar 13 in the Y direction. The sensing element 14 also is one type of magnetoelectric transducers, and is specifically a hole element. The sensing element 14 is arranged such that its magnetism sensing direction is oriented in the X direction. The sensing element 14 and the bus bar 13 are at a same position in the Y direction. Thus, in other words, the sensing element 14 is arranged such that its magnetism sensing direction is oriented in the X direction on a line passing through the bus bar 13 in the Z direction. The sensing element 14 is arranged adjacent to the bus bar 13 on a same side as the sensing element 4 being located relative to the bus bar 3. In other words, the sensing elements 4, 14 are both arranged on an upper side of the bus bars 3, 13. The sensing element 14 measures an intensity of a magnetic field generated by the current flowing in the bus bar 13. Since a current measurement principle of the sensing element 14 is same as that of the sensing element 4, a description thereof will be omitted.

The sensing elements 4, 14 are fixed to the sensor substrate 7. The sensor substrate 7 is mounted with a circuit for relaying power to be supplied to the sensing elements 4, 14 and for sending measured signals from the sensing elements 4, 14 to a superior control circuit. Signal lines for communicating with the superior control circuit and power supply lines extend from the sensor substrate 7, however, depiction thereof is omitted. A circuit for converting the intensity of the magnetic field to the magnitude of the current (transducer circuit) may be mounted on the sensor substrate 7, or may be mounted on the superior control circuit that communicates with the sensor substrate 7. In the latter case, the superior control circuit is also included in the current sensor 2.

The pair of shield plates 5, 6 sandwiches the bus bars 3, 13, the sensing elements 4, 14, and the sensor substrate 7 therebetween from both sides in the Z direction. The pair of shield plates 5, 6 is one type of magnetic shields, and is constituted of a material that has high magnetic field absorbing rate. The pair of shield plates 5, 6 is provided for shielding the sensing element 4 from a magnetic field other than the magnetic field generated by the current in the bus bar 3 which is a current measurement target, and shielding the sensing element 14 from a magnetic field other than the magnetic field generated by the current in the bus bar 13 which is a current measurement target. The pair of shield plates 5, 6 is constituted of, for example, iron, permalloy, or the like. It should be noted that a property of one shield plate 5 differs from a property of the other shield plate. Differences in the properties of the pair of shield plates 5, 6 will be described in detail later. Further, hereinbelow, the shield plate 5 is expressed as "lower shield plate 5" and the shield plate 6 is expressed as "upper shield plate 6" for easier identification of the shield plates in the drawings.

The sensing elements 4, 14, the sensor substrate 7, and the pair of shield plates 5, 6 are sealed in the resin package 8 together with parts of the bus bars 3, 13. It should be noted, in FIGS. 1 and 2, a portion of the resin package 8 surrounding an exterior of the pair of shield plates 5, 6 is omitted from the drawings for easier understanding.

As aforementioned, the sensing element 4 measures the intensity of the magnetic field generated by the current flowing in the bus bar 3. The sensing element 14 measures the intensity of the magnetic field generated by the current flowing in the bus bar 13. The sensing element 4 is located closer to the bus bar 3 than to the bus bar 13, and the sensing element 14 is located closer to the bus bar 13 than to the bus bar 3. However, the magnetic field generated by the bus bar 13 affects the sensing element 4, and the magnetic field generated by the bus bar 3 affects the sensing element 14. Suppression of an influence of the magnetic field generated by the bus bar 13 on the sensing element 4 as well as an influence of the magnetic field generated by the bus bar 3 on the sensing element 14 contributes to improvement of measurement accuracy of the current sensor 2. To suppress the influences of the adjacent bus bars, different properties are set for the pair of shield plates 5, 6 in the current sensor 2. Next, the pair of shield plates 5, 6 will be described in detail. It should be noted, hereinbelow, the sensing element 4 for detecting the magnetic field generated by the bus bar 3 will be focused, and the explanation will continue by regarding the bus bar 13 as a generating source of a noise magnetic field.

The pair of shield plates 5, 6 is both flat plates. The pair of shield plates 5, 6 is arranged in parallel. The pair of shield plates 5, 6 is arranged so as to satisfy a following relationship in its cross section that is cut along a plane passing through the sensing element 4 and extending in the X direction and the Z direction. That is, the pair of shield plates 5, 6 is arranged such that their facing surfaces (an upper surface 5a of the lower shield plate 5 and a lower surface 6a of the upper shield plate 6) become line-symmetric relative to a line CL extending in the X direction. Hereinbelow, this line CL will be termed a symmetric axis CL. FIG. 2 shows the cross section of the current sensor 2 cut along the plane extending in the X direction and the Z direction. The bus bar 3 is arranged below the symmetric axis CL, and the sensing element 4 is arranged above the symmetric axis CL. In other words, the bus bar 3 is arranged closer to the lower shield plate 5 than to the upper shield plate 6, and the sensing element 4 is arranged closer to the upper shield plate 6 than to the lower shield plate 5. In the current sensor 2, the property of the lower shield plate 5 is set to be different from the property of the upper shield plate 6 so that an influence of the noise magnetic field at the position of the sensing element 4 is suppressed as compared to a case where the pair of shield plates has the same property. This noise magnetic field refers to the magnetic field generated by the current flowing in the bus bar 13. It should be noted, since the bus bar 13 generally is located at a middle point between the pair of shield plates 5, 6, an intensity of the magnetic field acting on each of the shield plates 5, 6 is generally same.

Figure 3:
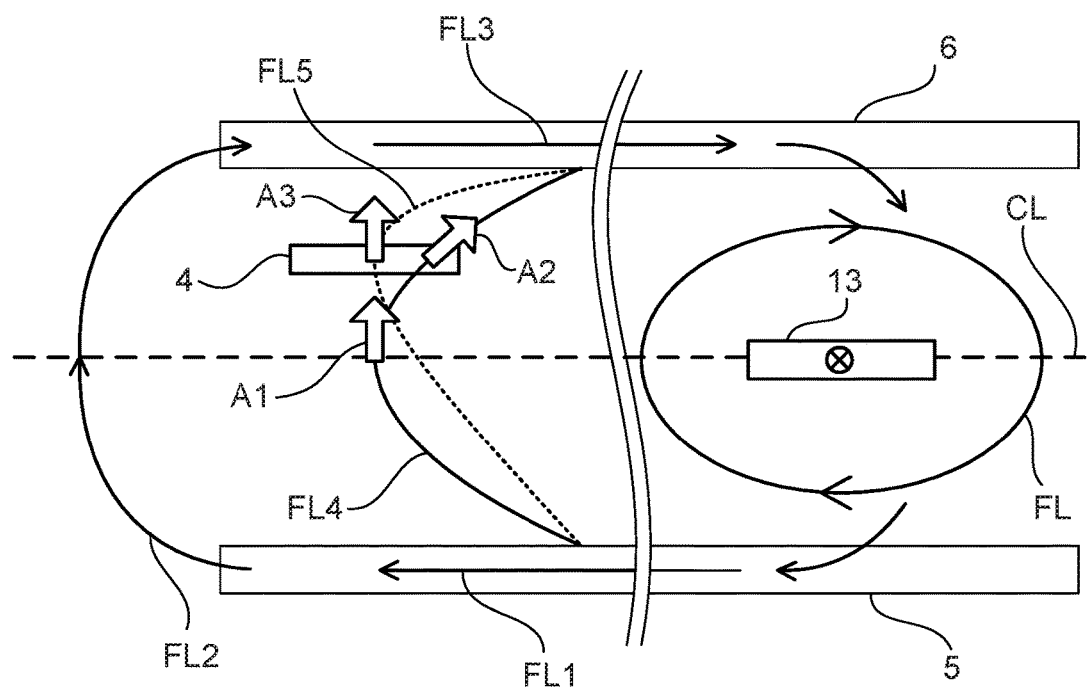
FIG. 3 is a diagram explaining an influence of an inter-shield magnetic field on a sensing element.

FIG. 3 is a diagram explaining the influence imposed on the sensing element 4 by the noise magnetic field. In FIG. 3, the measurement target bus bar 3, the sensor substrate 7, and the resin package 8 are omitted therefrom. Further, in FIG. 3, to enhance understanding, sizes and positional relationships of the respective components are depicted differently from those of FIGS. 1 and 2. A mark shown within a rectangle indicating the bus bar 13 in FIG. 3 shows that the current is flowing depthwise from a sheet front side. At this occasion, an orientation of the noise magnetic field in a surrounding of the bus bar 13 is clockwise relative to a sheet surface. Curves shown by a reference sign FL in FIG. 3 mean magnetic flux lines that show the noise magnetic field.

The noise magnetic field is absorbed by the pair of shield plates 5, 6. The magnetic flux lines FL showing the noise magnetic field pass through the lower shield plate 5 (FL1), exit from an end thereof (FL2), and enter to an end of the upper shield plate 6 (FL3). It should be noted, in FIG. 3, the magnetic flux lines that exit from a right end of the upper shield plate 6 and enter to a right end of the lower shield plate 5 are omitted from the drawing.

The magnetic flux passing through the pair of shield plates 5, 6 leaks also from the upper surface 5a of the lower shield plate 5. The leaked magnetic flux advances toward the upper shield plate 6. A reference sign FL4 shows the leaked magnetic flux lines. Hereinbelow, a magnetic field generated between the pair of shield plates 5, 6 due to the noise magnetic field will be termed an inter-shield magnetic field.

In a case where the pair of shield plates 5, 6 has the same property, and their facing surfaces (the upper surface 5a of the lower shield plate 5 and the lower surface 6a of the upper shield plate 6) become line-symmetric in their cross section, a shape (profile) of the inter-shield magnetic field becomes line-symmetric relative to the symmetric axis CL (FL4 in FIG. 3). In this case, the magnetic flux lines of the inter-shield magnetic field vertically traverse the symmetric axis CL. An arrow A1 in FIG. 3 shows an orientation of the inter-shield magnetic field on the symmetric axis CL. The inter-shield magnetic field does not have an X direction component (magnetism sensing direction component) on the symmetric axis CL. Therefore, if the sensing element 4 is arranged on the symmetric axis CL, the inter-shield magnetic field would not affect the sensing element 4. However, when the sensing element 4 is arranged on the symmetric axis CL, an interval for arranging the bus bar 3 (see FIG. 2) becomes necessary between the sensing element 4 and the lower shield plate 5, meanwhile, the same interval will also need to be provided between the sensing element 4 and the upper shield plate 6. This space between the sensing element 4 and the upper shield plate 6 is wasteful, and would increase a size of the current sensor 2. On the other hand, in a case where the wasteful space between the pair of shield plates 5, 6 is omitted and the upper shield plate 6 is brought closer to the sensing element 4, the symmetric axis CL shifts downward from the position of the sensing element 4. In this case, the inter-shield magnetic field at the position of the sensing element 4 comes to have the X direction component (magnetism sensing direction component) (see an arrow A2 in FIG. 3). The X direction component (magnetism sensing direction component) of the inter-shield magnetic field affects a value measured by the sensing element 4, that is, affects the measurement accuracy of the current sensor 2.

In the current sensor 2, the line symmetry of the inter-shield magnetic field is intentionally broken by giving different properties to the pair of shield plates 5, 6 respectively to reduce the X direction component of the inter-shield magnetic field at the position of the sensing element 4. For example, when the magnetic flux lines of the inter-shield magnetic field exhibit a curve shown by a dotted line FL5 in FIG. 3, the inter-shield magnetic field at the position of the sensing element 4 is oriented in the Z direction (an arrow A3 of FIG. 3). At this occasion, the X direction component (magnetism sensing direction component) of the inter-shield magnetic field at the position of the sensing element 4 becomes zero. If the shape (profile) of the inter-shield magnetic field can at least be shifted toward the upper shield plate 6, the influence that the inter-shield magnetic field imposes on the sensing element 4 can be suppressed as compared to the case where the pair of shield plates 5, 6 has the same property. In other words, if a point where the X direction component of the inter-shield magnetic field becomes zero can be shifted toward the upper shield plate 6, the influence that the inter-shield magnetic field imposes on the sensing element 4 can be suppressed as compared to the case where the pair of shield plates 5, 6 has the same property.

As a result of having conducted a simulation by giving various properties to the pair of shield plates 5, 6, it has been found that the X direction component of the inter-shield magnetic field can be reduced if one of a thickness and a magnetic permeability of the shield plates is set larger for the upper shield plate 6 (shield plate closer to the sensing element) than for the lower shield plate 5 (shield plate farther away from the sensing element 4).

Figure 4:
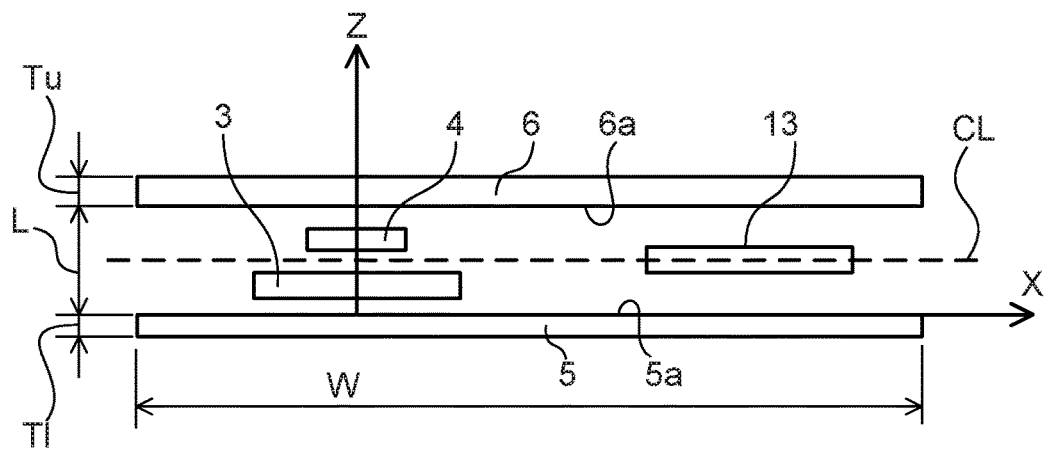
FIG. 4 is a diagram explaining conditions for a simulation.

Hereinbelow, the simulation will be described. In the simulation, comparisons were made regarding the X direction component of a magnetic flux density in the inter-shield magnetic field at the position of the sensing element for a case where the above condition is met and for a case where it is not met. The simulation conditions are shown in FIG. 4. In the simulation, the sensor substrate 7, the sensing element 14, and the resin package 8 were ignored. The bus bar 13 being the noise source was arranged at the middle point between the pair of shield plates 5, 6. Thus, the magnetic field generated by the current flowing in the bus bar 13 acted on both of the shield plates 5, 6 with a same intensity.

A range L between the pair of shield plates 5, 6 was 6.5 (mm). A width W of each shield plate 5, 6 was 60 (mm). A non-oriented electromagnetic steel band "50A290" defined in the JIS Standard (C 2552-1986) was employed for each of the shield plates 5, 6. An origin of the X axis and the Z axis was set on the upper surface 5a of the lower shield plate 5.

In Case 1 of the simulation, an advantageous effect of a difference in the thicknesses of the upper and lower shield plates was confirmed. In Case 1, the thickness Tu of the upper shield plate 6 was set to 2.0 (mm), and the thickness Tl of the lower shield plate 5 was set to 1.0 (mm). Two comparative examples were also simulated. A condition for Comparative Example 1 was: the thickness Tu of the upper shield plate 6=the thickness Tl of the lower shield plate 5=1.5 (mm) (other conditions were same as those of Case 1). A condition for Comparative Example 2 was: the thickness Tu of the upper shield plate 6=1.0 (mm), the thickness Tl of the lower shield plate 5=2.0 (mm) (other conditions were same as those of Case 1).

Figure 5:
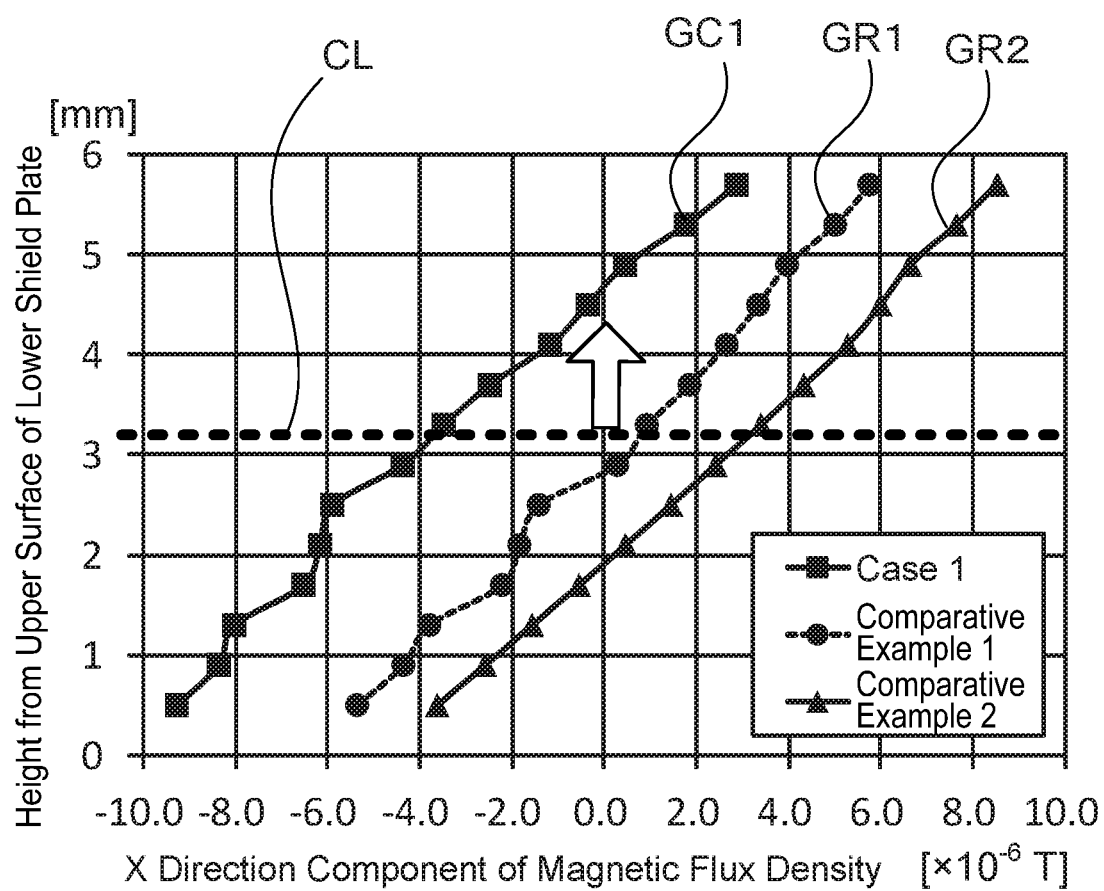
FIG. 5 is a graph showing results of the simulation (for a case of using different thicknesses)

A result of Case 1 is shown in FIG. 5. A vertical axis of this graph shows a height h from the upper surface 5a of the lower shield plate 5. Tick marks of the vertical axis are indicated in (mm). A broken line at the height h=3.25 (mm) is a half value (L/2) of the range L between the pair of shield plates 5, 6. This value (L/2) means the aforementioned symmetric axis CL. A horizontal axis shows the X direction component of a magnetic flux density T of the magnetic field (inter-shield magnetic field) penetrating a sensor of the sensing element 4 when the sensing element 4 is at respective heights. Tick marks of the horizontal axis are indicated in ($\times 10^{-6}$ T (tesla)). Hereinbelow, for simplifying the description, the X direction component of the magnetic flux density of the inter-shield magnetic field will simply be termed "X component of the density". When the X component of the density is a positive value, this means that the magnetic flux density has a positive direction component of the X axis in FIG. 4. When the X component of the density is a negative value, this means that the magnetic flux density has a negative direction component of the X axis in FIG. 4. Meanings of the vertical and horizontal axes in the graph will be the same for graphs to be described hereafter. It should be noted that a numerical value is also indicated for a height range corresponding to a hight of the bus bar 3. Although it is physically impossible for the bus bar 3 and the sensing element 4 to overlap each other, such is enabled in the simulation. Notably, the bus bar 3 is a conductor, and thereby, the bus bar 3 imposes merely a small influence on the inter-shield magnetic field by which the sensing element 4 is to be affected.

Firstly, Comparative Example 1 (case where the thicknesses of the upper and lower shield plates are the same) will be described. A graph GR1 shows the result for Comparative Example 1. In Comparative Example 1, the X component of the density increases substantially linearly from its minimum value (negative value) as the height h increases from zero. The X component of the density becomes zero at a point where the height h matches the symmetric axis CL. The graph GR1 generally is point-symmetric with an intersection with the symmetric axis CL as a center. The graph GR1 indicates that when the properties (thickness and magnetic permeability) of the upper and lower shield plates 5, 6 are equal, the profile (shape) of the inter-shield magnetic field becomes line-symmetric relative to the symmetric axis CL as shown by the curve FL4 of FIG. 4.

A graph GC1 shows the result for Case 1. The graph GC1 has a profile (shape) in which the graph GR1 of Comparative Example 1 has shifted upward. In Case 1, the X component of the density becomes zero at a position where the height h is approximately 4.5 (mm). This means that the profile of the inter-shield magnetic field becomes similar to the dotted line FL5 of FIG. 4 when the thickness Tu of the upper shield plate 6 is larger than the thickness Tl of the lower shield plate 5.

A graph GR2 shows the result for Comparative Example 2 (case where the thickness Tl of the lower shield plate 5>the thickness Tu of the upper shield plate 6). Opposite to the graph GC1 of Case 1, the graph GR2 has a profile (shape) in which the graph GR1 of Comparative Example 1 has shifted downward. From the results of Case 1 and Comparative Examples 1, 2, it can be understood that when the thickness of one of the pair of shield plates 5, 6 is set larger than the thickness of the other thereof, the profile of the inter-shield magnetic field is offset toward a side where the shield plate with the larger thickness is. In other words, it can be understood that when the thickness of one of the pair of shield plates 5, 6 is set larger than the thickness of the other thereof, the position where the X component of the density becomes zero is offset toward the side where the shield plate with the larger thickness is. Due to this, it can be understood that, when the thickness of the shield plate closer to the sensing element 4 (upper shield plate 6) is made larger than the thickness of the shield plate farther away from the sensing element 4 (lower shield plate 5), the influence that the inter-shield magnetic field imposes on the sensing element 4 can be suppressed as compared to the case where the pair of shield plates 5, 6 have the same properties.

In Case 2 of the simulation, an advantageous effect of a difference in the magnetic permeabilities was confirmed. It should be noted, due to complications in the simulation, the magnetic permeability could not be set as a parameter, and thus iron loss was set as the parameter instead. The iron loss and the magnetic permeability are generally in an inverse proportional relationship. That is, the magnetic permeability becomes larger as the iron loss is smaller. For example, FIG. 2 of Japanese Patent Application Publication No. 2006-241519 describes this feature.

In Case 2, a non-oriented electromagnetic steel band "50A1300" defined in the JIS Standard (C 2552-1986) was employed as the shield plate 5. For the upper shield plate 6, the non-oriented electromagnetic steel band "50A290" was employed, similarly to Case 1. The iron loss of "50A290" is equal to or less than 2.90 (W/kg, W15/50, AT 1.5 T/50 Hz), and the iron loss of "50A1300" is 13.00 (W/kg, W15/50, AT 1.5 T/50 Hz). The iron loss of "50A290" is smaller than the iron loss of "50A1300". That is, the magnetic permeability Mu of the upper shield plate 6 is larger than the magnetic permeability Ml of the lower shield plate 5. It should be noted that the thicknesses of the pair of shield plates 5, 6 were set to 1.5 (mm).

Figure 6:
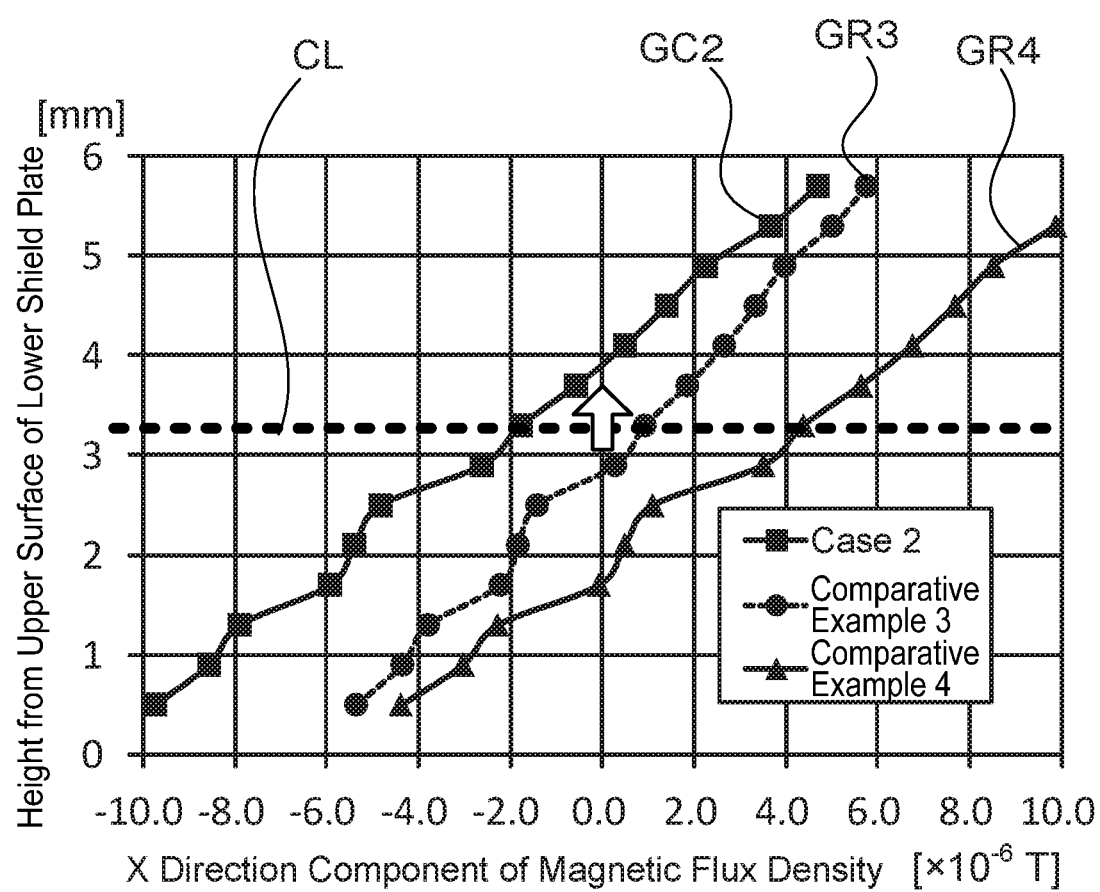
FIG. 6 is a graph showing results of the simulation (for a case of using different magnetic permeabilities)

Results of Case 2 are shown in FIG. 6. The meanings of the vertical and horizontal axes are same as those of FIG. 5. A graph GR3 showing the result for Comparative Example 3 is same as that of Comparative Example 1 for Case 1. That is, the graph G3 of Comparative Example 3 shows the result for the case of using the pair of shield plates of which thicknesses and the magnetic permeabilities are the same.

The graph GR3 indicates that when the properties (thickness and magnetic permeability) of the upper and lower shield plates 5, 6 are equal, the profile of the inter-shield magnetic field becomes line-symmetric relative to the symmetric axis CL, similarly to the curve FL4 of FIG. 4.

A graph GC2 shows the result for Case 2. The graph GC2 also has a profile in which the graph GR3 of Comparative Example 3 has shifted upward, similarly to the aforementioned graph GC1. In Case 2, the X component of the density becomes zero at a position where the height h is approximately 3.9 (mm). This means that the profile of the inter-shield magnetic field becomes similar to the dotted line FL5 of FIG. 4 when the magnetic permeability Mu of the upper shield plate 6 is larger than the magnetic permeability Ml of the lower shield plate 5.

In Comparative Example 4, the non-oriented electromagnetic steel band "50A1300" was employed as the upper shield plate 6, and the non-oriented electromagnetic steel band "50A290" was employed as the lower shield plate 5. These thicknesses were set to 1.5 (mm). A graph GR4 shows the result for Comparative Example 4. Opposite to the graph GC2 of Case 2, the graph GR4 has a profile in which the graph GR3 of Comparative Example 3 has shifted downward. From the results of Case 2 and Comparative Examples 3, 4, it can be understood that when the magnetic permeability of one of the pair of shield plates 5, 6 is set larger than the magnetic permeability of the other thereof, the profile of the inter-shield magnetic field is offset toward a side where the shield plate with the larger magnetic permeability is. In other words, it can be understood that when the magnetic permeability of one of the pair of shield plates 5, 6 is set larger than the magnetic permeability of the other thereof, the position where the X component of the density becomes zero is offset toward the side where the shield plate with the larger magnetic permeability is. Due to this, it can be understood that, when the magnetic permeability of the shield plate closer to the sensing element 4 (upper shield plate 6) is made larger than the magnetic permeability of the shield plate farther away from the sensing element 4 (lower shield plate 5), the influence that the inter-shield magnetic field imposes on the sensing element 4 can be suppressed as compared to the case where the pair of shield plates 5, 6 have the same properties.

Case 1 (the thickness Tu of the upper shield plate 6>the thickness Tl of the lower shield plate 5) of the simulation indicates one embodiment. Further, Case 2 (the magnetic permeability Mu of the upper shield plate 6>the magnetic permeability Ml of the lower shield plate 5) of the simulation indicates another embodiment. The thickness and the magnetic permeability of the shield plates can achieve the above advantageous effects independently of each other. Due to this, an even greater advantageous effect can be expected by setting both of the thickness and the magnetic permeability larger for the upper shield plate 6 than for the lower shield plate 5.

Figure 7:
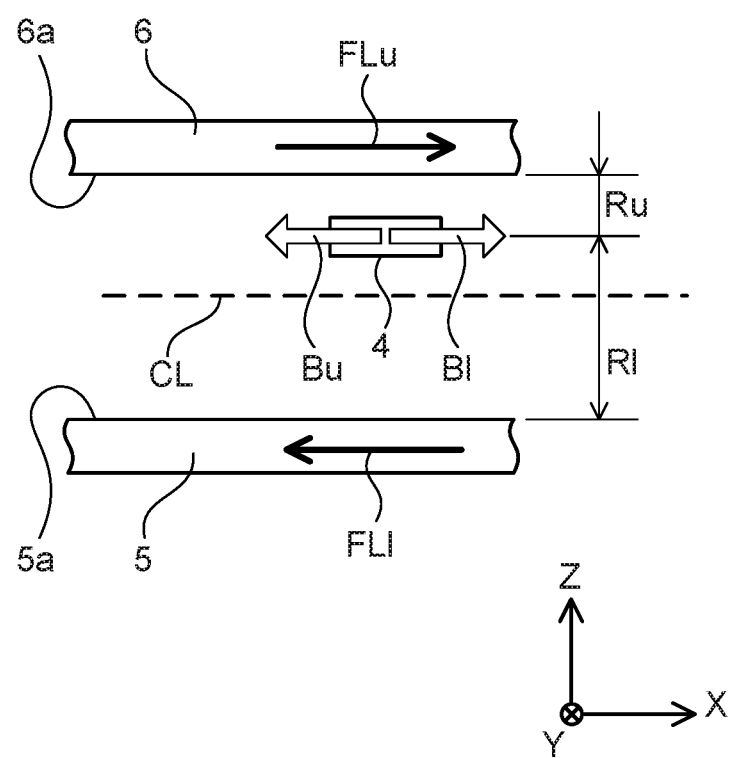
FIG. 7 is a diagram explaining a relationship between a sensing element position and the magnetic permeabilities of shield plates.

Referring to FIG. 7, a relationship between ranges between the respective shield plates 5, 6 and the sensing element 4, and the magnetic permeabilities of the respective shield plates 5, 6 will be considered. In FIG. 7, a reference sign Ru indicates a range between the upper shield plate 6 and the sensing element 4. A reference sign Rl indicates a range between the lower shield plate 5 and the sensing element 4. A reference sign FLu indicates a magnetic flux passing through the upper shield plate 6. A reference sign FL1 indicates a magnetic flux passing through the lower shield plate 5. Further, the magnetic permeability of the upper shield plate 6 is denoted by a sign Mu, and the magnetic permeability of the lower shield plate 5 is denoted by a sign Ml.

A sign Bu in FIG. 7 shows the X component of the density (X direction component of the magnetic flux density) exhibited at the position of the sensing element 4 by the magnetic flux FLu passing through the upper shield plate 6. A sign Bl shows the X component of the density exhibited at the position of the sensing element 4 by the magnetic flux FL1 passing through the lower shield plate 5. Notably, orientations of the magnetic flux FLu passing through the upper shield plate 6 and the magnetic flux FL1 passing through the lower shield plate 5 are in opposite directions. Due to this, the X direction component of the magnetic field generated by the magnetic flux FLu and the X direction component of the magnetic field generated by the magnetic flux FL1 are oriented in opposite directions from each other. In FIG. 7, arrows indicated respectively by the X component of the density Bu and the X component of the density Bl facing opposite directions show the orientations of the magnetic fields. According to a study by the inventor, a relationship as below is established for the X components of the densities Bu, Bl.

$$Bu \propto au \cdot \frac{(M0)H}{2PAI(Ru)} \quad \text{[Eq. 1]}$$

$$au \propto 1/(Mu)$$

$$\therefore Bu \propto \frac{(M0)H}{2PAI(Ru)(Mu)}$$

$$Bl \propto al \cdot \frac{(M0)H}{2PAI(Rl)}$$

$$al \propto 1/(Ml)$$

$$\therefore Bu \propto \frac{(M0)H}{2PAI(Ru)(Ml)}$$

In the above (Eq. 1), a sign H denotes the intensity of the magnetic field in each of the shield plates 5, 6. As aforementioned, the noise magnetic field of the same intensity acts on each of the shield plates 5, 6. Due to this, the intensity H of the magnetic field is the same for the upper shield plate 6 and for the lower shield plate 5. Further, in (Eq. 1), a sign M0 denotes the magnetic permeability in vacuum. A sign PAI denotes the circular constant. A sign au denotes a leak magnetic flux coefficient in the upper shield plate 6. A sign al denotes a leak magnetic flux coefficient in the lower shield plate 5. (Eq. 2) as below can be derived from (Eq. 1).

$$\text{if}(Mu)(Ru)=(Ml)(Rl)$$

$$\text{then } Bu=Bl \quad \text{[Eq. 2]}$$

(Eq. 2) indicates the following. That is, if a product (Mu*Ru) of the magnetic permeability Mu of the upper shield plate 6 and the range Ru between the upper shield plate 6 and the sensing element 4 is equal to a product (Ml*Rl) of the magnetic permeability Ml of the lower shield plate 5 and the range Rl between the lower shield plate 5 and the sensing element 4, the X component of the density (X direction component of the magnetic flux density) becomes zero at the position of the sensing element 4. When the above relationship is satisfied, the influence imposed on the sensing element 4 by the noise magnetic flux can be significantly suppressed. In other words, if the above relationship is satisfied, the measurement accuracy of the current sensor can significantly be improved while reducing the wasteful space of the pair of shield plates 5, 6.

Figure 8:
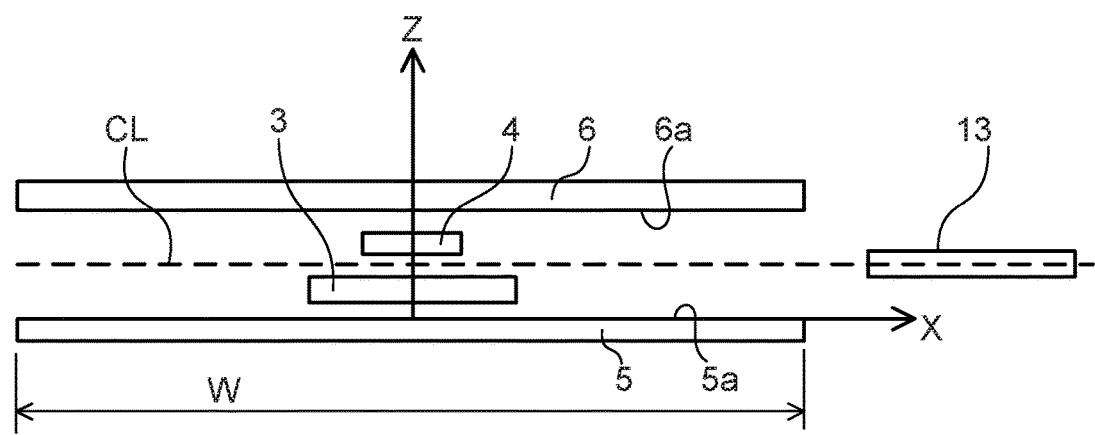
FIG. 8 is a diagram explaining conditions for another simulation.

In the simulation as presented earlier, the bus bar 13 being the noise source was arranged between the pair of shield plates 5, 6. A simulation was carried out also for a case where the bus bar 13 was arranged outside the pair of shield plates 5, 6. Conditions of the simulation is shown in FIG. 8. The bus bar 3 and the sensing element 4 were arranged at the middle of the pair of shield plates 5, 6 in the X direction. The bus bar 13 (conductor being the noise source) was arranged outside the pair of shield plates 5, 6 in the X direction. In the Z direction, the bus bar 13 was arranged at the middle of the pair of shield plates 5, 6. Due to this, the magnetic field generated by the current flowing in the bus bar 13 acts at the same intensity on each of the shield plates 5, 6. Conditions other than the layout of the pair of shield plates 5, 6, the bus bars 3, 13, and the sensing element 4 are same as those of the simulation as presented earlier.

In Case 3, the thicknesses of the upper shield plate 6 and the lower shield plate 5 were made different. A condition for Case 3 was: the thickness Tu of the upper shield plate 6=2.0 (mm) and the thickness Tl of the lower shield plate 5=1.0 (mm). The materials employed for the respective shield plates 5, 6 are both the non-oriented electromagnetic steel band of "50A290" defined in JIS Standard "C 2552-1986".

Figure 9:
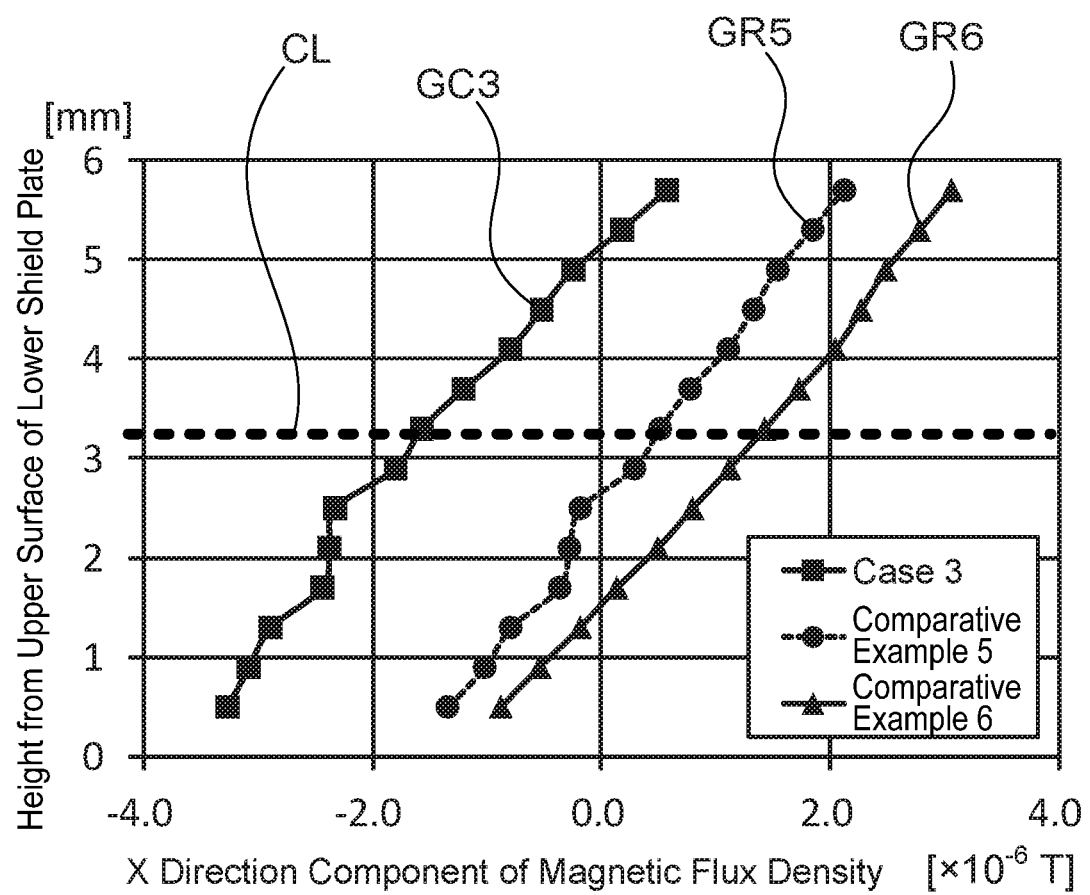
FIG. 9 is a graph showing results of the other simulation (for a case of using different thicknesses)

A graph GC3 in FIG. 9 shows a simulation result of Case 3. Aside from this, Comparative Examples 5, 6 were also simulated. A condition of Comparative Example 5 was: the thickness Tu of the upper shield plate 6=the thickness Tl of the lower shield plate 5=1.5 (mm) (other conditions are same as those of Case 3). A condition of Comparative Example 6 was: the thickness Tu of the upper shield plate 6=1.0 (mm) and the thickness Tl of the lower shield plate 5=2.0 (mm). A graph GR5 shows a result of Comparative Example 5, and a graph GR6 shows a result of Comparative Example 6. The graphs GC3, GR5, GR6 exhibit the same trends as Case 1 (FIG. 5). Thus, from the results of FIG. 9 as well, it can be understood that, when the thickness of the shield plate closer to the sensing element 4 (upper shield plate 6) is made larger than the thickness of the shield plate farther away from the sensing element 4 (lower shield plate 5), the influence that the inter-shield magnetic field imposes on the sensing element 4 can be suppressed as compared to the case where the pair of shield plates 5, 6 have the same properties.

In Case 4, the magnetic permeabilities of the upper shield plate 6 and the lower shield plate 5 were made different. In Case 3, a material with a high magnetic permeability Mu was employed for the upper shield plate 6, and a material with a low magnetic permeability Ml was employed for the lower shield plate 5. Specifically, the non-oriented electromagnetic steel band "50A290" defined in the JIS Standard (C 2552-1986) was employed as the upper shield plate 6. The non-oriented electromagnetic steel band "50A1300" was employed as the lower shield plate 5. Both of the shield plates were given the thickness of 1.5 (mm). These conditions are same as the conditions of Case 2.

Figure 10:
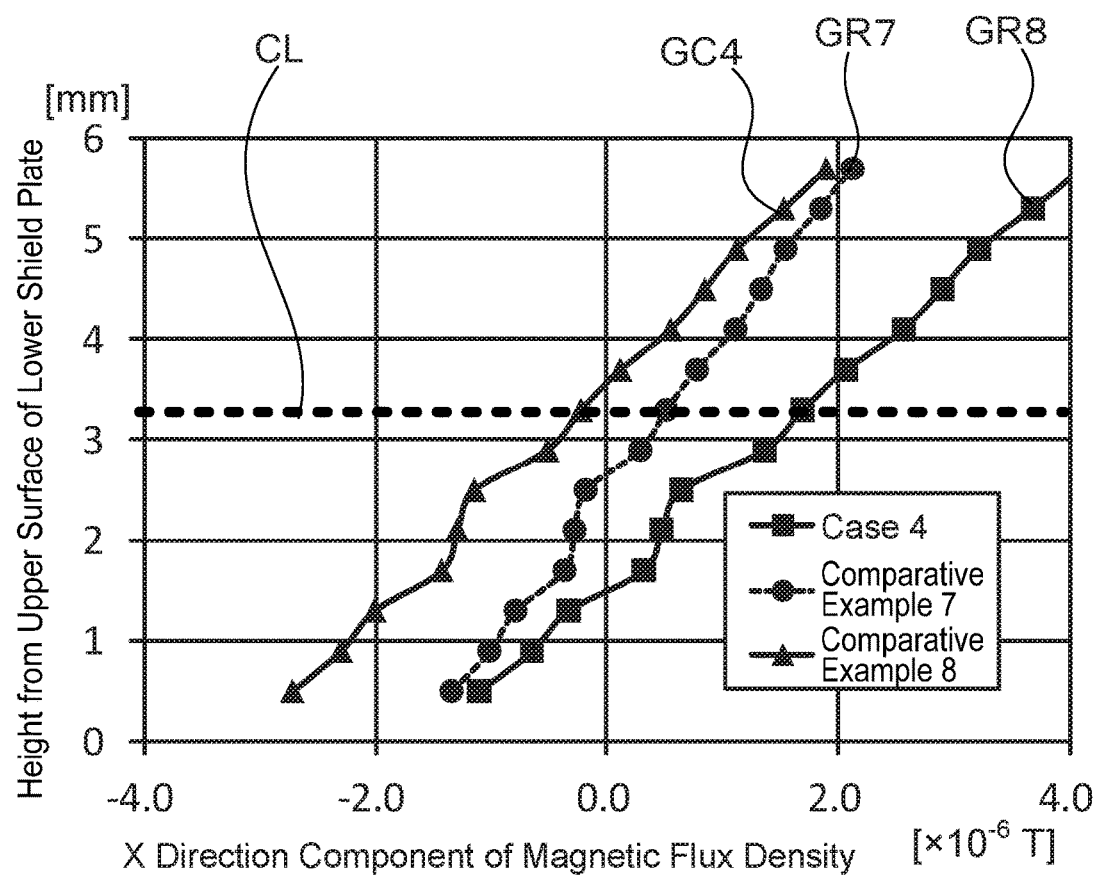
FIG. 10 is a graph showing results of the other simulation (for a case of using different magnetic permeabilities)

A graph GC4 in FIG. 10 shows a simulation result of Case 4. Aside from this, Comparative Examples 7, 8 were also simulated. In Comparative Example 7, the same material "50A290" was employed for the upper shield plate 6 and the lower shield plate 5 (other conditions are same as those of Case 4). In Comparative Example 8, the materials of Case 4 were switched. That is, the material with the low magnetic permeability Mu (50A1300) was employed as the upper shield plate 6, and the material with the high magnetic permeability Ml (50A290) was employed as the lower shield plate 5 (other conditions are same as those of Case 4). A graph GR7 shows a result of Comparative Example 7, and a graph GR8 shows a result of Comparative Example 8. The graphs GC4, GR7, GR8 exhibit the same trends as Case 2 (FIG. 6). Thus, from the results of FIG. 10 as well, it can be understood that, when the magnetic permeability of the shield plate closer to the sensing element 4 (upper shield plate 6) is made larger than the magnetic permeability of the shield plate farther away from the sensing element 4 (lower shield plate 5), the influence that the inter-shield magnetic field imposes on the sensing element 4 can be suppressed as compared to the case where the pair of shield plates 5, 6 have the same properties.

Figure 11:
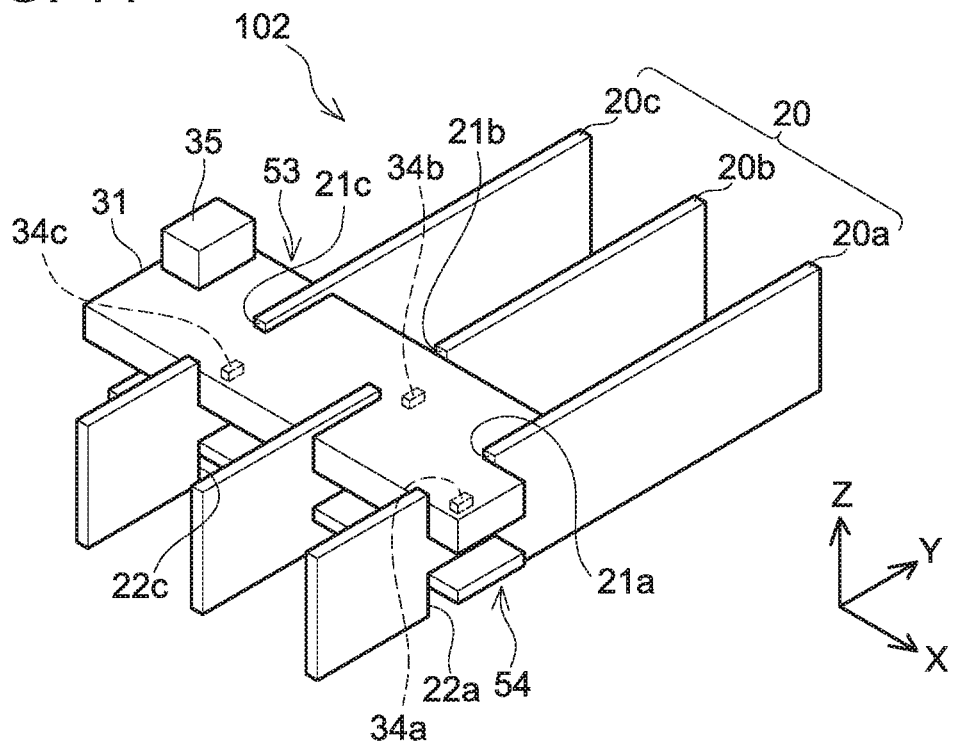
FIG. 11 is a perspective view of a current sensor 102 of another embodiment.

A current sensor 102 of another embodiment will be described with reference to FIGS. 11 to 14. FIG. 11 shows a perspective view of the current sensor 102 of the embodiment. The current sensor 102 measures a current flowing in each of three bus bars 20a, 20b, 20c supplying power to a three-phase alternating current motor. The current sensor 102 comprises the three bus bars 20a, 20b, 20c arranged in parallel, a sensor unit 53 arranged on the bus bars 20a, 20b, 20c at their upper sides, and a shield unit 54 arranged on the bus bars 20a, 20b, 20c at their lower sides. In this disclosure, the bus bars 20a, 20b, 20c may collectively be called bus bars 20. In the current sensor 102 of the present embodiment, shapes of the bus bars 20 are also characteristic, and as such, the bus bars 20 with the characteristic shapes are included in the configuration of the current sensor 102. In the drawings, it should be noted that only parts of the bus bars 20 extending long in the Y direction are depicted. The current sensor 102 is provided inside an inverter mounted on an electric vehicle. The inverter is a device for converting battery power to power suitable to be supplied to a driving motor. An output terminal which is to be connected to the motor is provided in the inverter. The current sensor 102 is provided at a part of the bus bars connecting the output terminal and an inverter circuit mounted in the inverter. The driving motor is a three-phase alternating current motor, and the inverter outputs a three-phase current. Due to this, the output terminal and the inverter circuit are connected by the three bus bars 20. In an electric vehicle, a current feedback control of the motor is executed to drive the motor at required torque. Current values measured by the current sensor 102 are utilized to determine a control amount of the current feedback control.

As shown in FIG. 11, the sensor unit 53 is fitted in notches 21a, 21b, 21c provided respectively on the upper sides of the bus bars 20. The sensor unit 53 is provided with three sensing elements 34a, 34b, 34c on an inside thereof. The sensing elements 34a, 34b, 34c are magnetoelectric transducers configured to measure intensities of magnetic fields. The sensing elements 34a, 34b, 34c have only one direction in which a magnetic field can be measured. Although the details will be described later, the sensing elements 34a, 34b, 34c are positioned respectively inside the notches 21a, 21b, 21c by the sensor unit 53 fitting in the notches 21a, 21b, 21c. It should be noted, hereinbelow, if the sensing elements 34a, 34b, 34c are to be indicated without a need of distinguishing them, they will be termed sensing elements 34. Further, the shield unit 54 is fitted in notches 22a, 22b, 22c provided respectively on the lower sides of the bus bars 20 (notch 22b is not shown in FIG. 11, see FIG. 12).

Figure 12:
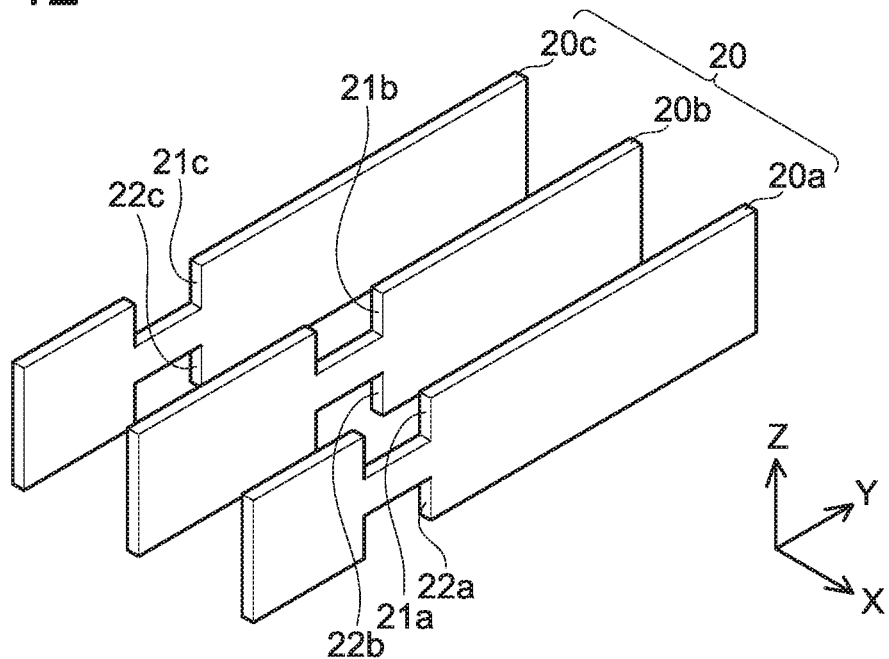
FIG. 12 is a perspective view showing only bus bars.

By referring to FIG. 12, a configuration of the bus bars 20 will be described. FIG. 12 is a perspective view that shows only the bus bars 20 in a state where the sensor unit 53 and the shield unit 54 are detached from the current sensor 102. A high current flows in the motor of the electric vehicle. Due to this, the bus bars 20 constituted of elongate metal plates are employed to make internal resistances small. As shown in FIG. 12, the bus bars 20 are elongate metal plates. The bus bars 20a, 20b, 20c are arranged in parallel such that their wide side surfaces face each other. Further, the bus bars 20a, 20b, 20c are arranged such that their narrow side surfaces are lined in an up-and-down direction (Z direction). In other words, the three bus bars 20a, 20b, 20c are aligned in the X direction and extend parallel in the Y direction. Further, thicknesses of the bus bars 20a, 20b, 20c in the X direction are same.

As shown in FIG. 12, the bus bars 20a, 20b, 20c are respectively provided with the rectangular notches 21a, 21b, 21c and the rectangular notches 22a, 22b, 22c. The notches 21a, 21b, 21c have a same shape, and the notches 22a, 22b, 22c also have a same shape. In the bus bar 20a, the notch 21a is located on the upper side of the bus bar 20a, and the notch 22a is located on the lower side of the bus bar 20a. The notch 21a and the notch 22a are arranged at a same position in an extending direction of the bus bar 20a (that is, the Y direction). The notches 21b, 22c and the notches 22b, 22c are provided in other bus bars 20b, 20c respectively in the same positional relationship as that in the bus bar 20a.

Further, the notches 21a, 21b, 21c are arranged in a V shape when seen from above (that is, seen along the Z direction). In other words, the notch 21a of the bus bar 20a is arranged so as not to overlap with the notch 21b of the bus bar 20b, which is adjacent to the bus bar 20a, in the extending direction (Y direction). Similarly, the notch 21b of the bus bar 20b is arranged so as not to overlap with the notch 21c of the bus bar 20c, which is adjacent to the bus bar 20b, in the extending direction (Y direction).

Figure 13:
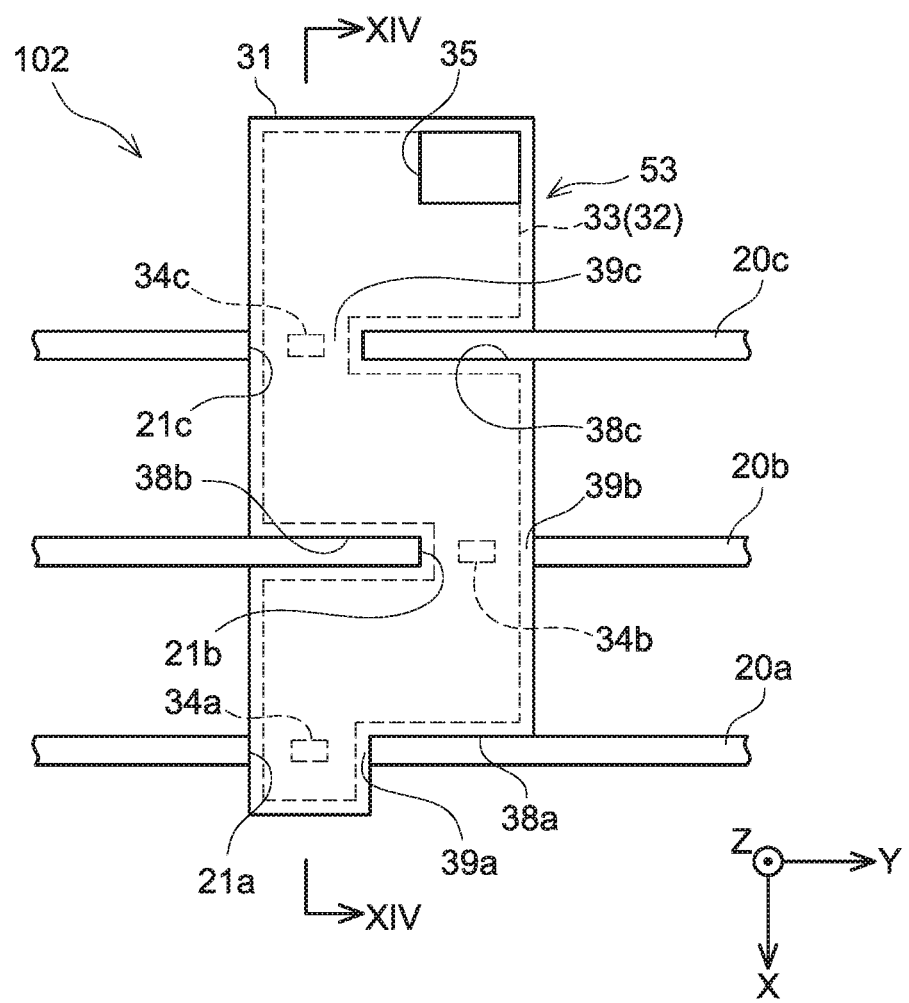
FIG. 13 is a plan view of the current sensor 102.

A configuration of the sensor unit 53 will be described with reference to FIG. 13. FIG. 13 is a plan view that sees the current sensor 102 from above (that is, seen along the Z direction). The sensor unit 53 is configured by molding the three sensing elements 34a, 34b, 34c, a sensor substrate 33 to which the sensing elements 34 are connected, and an upper shield plate 32 by injection molding using insulative resin. Hereinbelow, the insulative resin covering the sensing elements 34, the sensor substrate 33, and the upper shield plate 32 will be termed a resin package 31. The resin package 31 covers entire peripheral surfaces of the sensing elements 34, the sensor substrate 33, and the upper shield plate 32. In other words, the sensing elements 34, the sensor substrate 33, and the upper shield plate 32 are embedded inside the resin package 31. An outer shape of the sensor unit 53, that is, an outer shape of the resin package 31 is a flat plate-like shape. As shown in FIG. 13, the sensor unit 53 is arranged on the bus bars 20, and the resin package 31 is provided with a notch 38a corresponding to the bus bar 20a, and slits 38b, 38c corresponding respectively to the bus bars 20b, 20c. The notch 38a and the slits 38b, 38c penetrate the resin package 31 from an upper surface to a lower surface thereof, and also penetrate the sensor substrate 33 and the upper shield plate 32 provided inside the resin package 31. The slits 38b, 38c have a rectangular shape elongate in the extending direction of the bus bars (that is, Y direction), and have the same shape. As shown in FIG. 13, the notch 38a is provided on a side surface of the resin package 31 (side surface on an X axis-negative direction). The slit 38b extends from a side surface of the resin package 31 on an X axis-positive direction, and the slit 38c extends from the side surface of the resin package 31 on the X axis-negative direction. That is, the notch 38a and the slits 38b, 38c are arranged in a V shape. In other words, a fitting portion 39a, which is a portion that alignes with the notch 38a in the extending direction of the bus bars (Y direction), and fitting portions 39b, 39c respectively being portions forming straight lines with the slits 38b, 38c are arranged in the V shape. The sensor unit 53 is attached to the bus bars 20 by the fitting portions 39a, 39b, 39c arranged in the V shape respectively fitting with the notches 21a, 21b, 21c of the bus bars 20 which are arranged similarly in the V shape. At this occasion, the slits 38b, 38c fit with their corresponding bus bars 20b, 20c.

The sensing elements 34 measure the intensities of the magnetic fields generated by the currents flowing in the bus bars 20, and output voltage signals corresponding to the intensities of the magnetic fields. As shown in FIG. 13, the sensing element 34a is arranged inside the fitting portion 39a. The sensing element 34a is arranged inside the notch 21a by the fitting portion 39a being fitted in the notch 21a. Due to this, the sensing element 34a is arranged to face the bus bar 20a, and the intensity of the magnetic field generated by the current flowing in the bus bar 20a is measured by the sensing element 34a. The bus bar 20a extends in the Y direction, and the sensing element 34a is arranged so that its magnetism sensing direction is oriented in the X direction on a line passing through its corresponding bus bar 20a in the Z direction. Similarly, the sensing elements 34b, 34c are respectively arranged inside the fitting portions 39b, 39c. The sensing elements 34b, 34c are respectively arranged inside the notches 21b, 21c by the fitting portions 39b, 39c being fitted in the notches 21b, 21c. The bus bars 20b, 20c extend in the Y direction, and the sensing elements 34b, 34c are arranged so that their magnetism sensing directions are oriented in the X direction on respective lines passing through their corresponding bus bars 20b, 20c in the Z direction. The intensity of the magnetic field generated by the current flowing in each of the bus bars 20b, 20c is measured by the corresponding one of the sensing elements 34b, 34c.

As shown in FIG. 13, an output terminal 35 is provided on the sensor unit 53 at its end in the direction in which the bus bars 20 are aligned (X direction). The output terminal 35 is connected to the sensor substrate 33. The voltage signals outputted from the sensing elements 34 are outputted to outside of the sensor unit 53 from the output terminal 35 via the sensor substrate 33.

Figure 14:
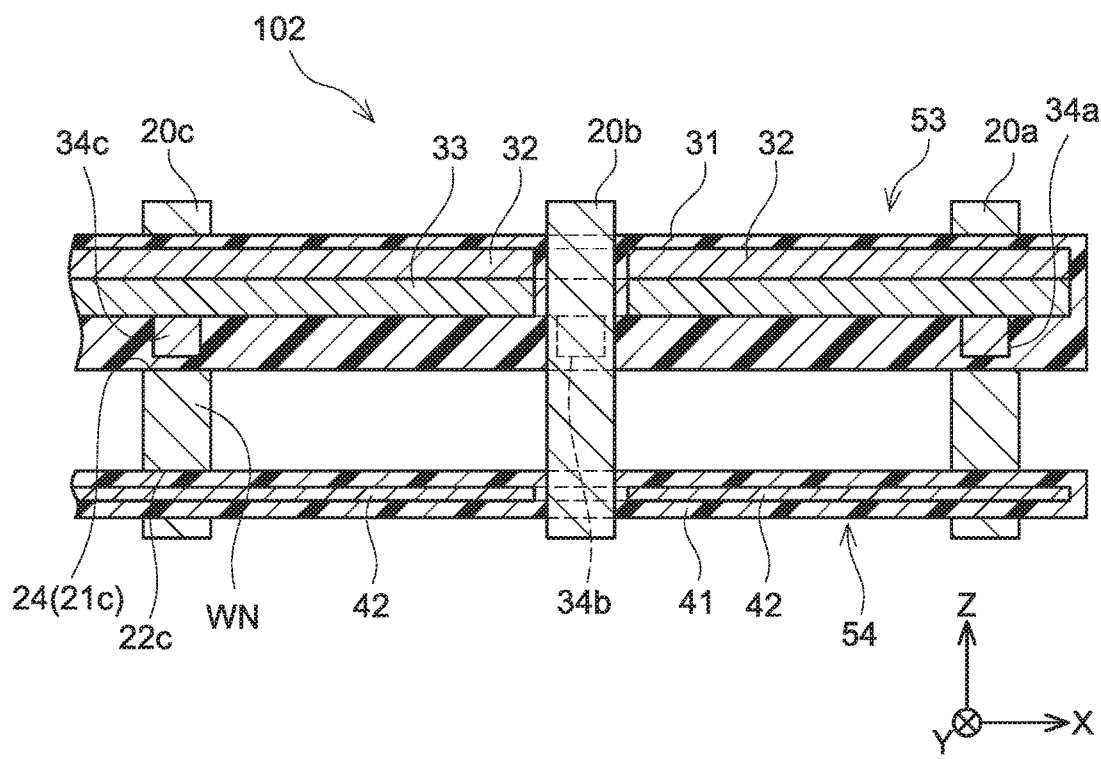
FIG. 14 is a cross sectional view along a line XIV-XIV in FIG. 13.

The sensor unit 53 will further be described, and the shield unit 54 will also be described with reference to FIG. 14. FIG. 14 shows a cross sectional view along a line XIV-XIV of FIG. 13. The line XIV-XIV of FIG. 13 shows a cross section that is orthogonal to the extending direction of the bus bars (Y direction), and that passes through the sensing elements 34a, 34c. As shown in FIG. 14, the sensing elements 34a, 34c are covered by the resin package 31. The sensing element 34b depicted by a broken line in FIG. 14 is also covered by the resin package 31.

The sensor substrate 33 is located above the sensing elements 34a, 34b, 34c, and the upper shield plate 32 is located on the sensor substrate 33. The sensor substrate 33 and the upper shield plate 32 are also covered by the resin package 31. Electrodes (not shown) are disposed at upper surfaces of the sensing elements 34a, 34b, 34c, and these electrodes are connected to the sensor substrate 33. The upper shield plate 32 is constituted of a material with a high magnetic permeability. Magnetic fields, which become noise generated by other electronic components (such as electronic components provided in the inverter circuit) outside of the upper shield plate 32 are collected in the upper shield plate 32. Thus, the sensing elements 34a, 34b, 34b are shielded from the magnetic field being noise generated outside the upper shield plate 32. It should be noted, as aforementioned, the resin package 31 is formed by injection molding. Thus, the sensing elements 34a, 34b, 34c, the sensor substrate 33, and the upper shield plate 32 are tightly in contact with the resin package 31.

Advantageous effects of the current sensor 102 will be described. Hereinbelow, the explanation will be given with the sensing element 34c as a representative element. As shown in FIG. 14, by providing the notch 21c and the notch 22c, a portion with a smaller lateral cross-sectional area (narrow portion WN) than a lateral cross-sectional area of a portion of the bus bar 20c where no notch is provided is configured between the notch 21c and the notch 22c. A current density of the current passing through the narrow portion WN becomes higher than a current density of the current passing through the portion of the bus bar 20c where no notch is provided. The intensity of the magnetic field generated around the narrow portion WN is increased due to the current density being increased by the narrow portion WN. Since the sensing element 34c senses such an increased magnetic field intensity, in the sensing element 34c, a ratio (SN ratio) of the magnetic field intensity of which measurement is targeted (the intensity of the magnetic field generated by the bus bar 20c) and the magnetic field that becomes noise (for example, the magnetic field generated from another electronic component or adjacent bus bar) is increased. The sensing element 34c can detect the intensity of the magnetic field generated by the current passing through the bus bar 20c with high accuracy. The same advantageous effect can be achieved for the sensing elements 34a, 34b.

It should be noted that the bus bars 20 extend in the Y direction, and the bus bars 20 and the sensing elements 34 are adjacent in the Z direction. Similar to the embodiment of FIGS. 1 to 10, the sensing elements 34 are arranged with their magnetism sensing directions oriented in the X direction.

Further, the sensing element 34c can accurately be positioned relative to the bus bar 20c by the fitting portion 39b of the resin package 31 fitting in the notch 21c of the bus bar 20c. Furthermore, in order to obtain even improved accuracy, it is preferable that an interval between the sensing element 34c and the bus bar 20c is defined to a desired range, and the sensing element 34c is brought closer to the bus bar 20c as possible. According to the above configuration, the interval between the sensing element 34c and the bus bar 20c can easily be defined by making a lower surface of the resin package 31 in contact with a bottom surface 24 of the notch 21c. Further, the interval can easily be adjusted by a thickness of the resin package 31. Further, since the resin package 31 is an insulator, insulation between the sensing element 34c and the bus bar 20c can be ensured as well. The same advantageous effect can be achieved for the sensing elements 34a, 34b.

Further, as aforementioned, the notch 21b provided in the bus bar 20b of the current sensor 102 is arranged so as not to overlap with the notches 21a, 21c provided in the adjacent bus bars 20a, 20c in the extending direction of the bus bars (Y direction). In other words, the notches 21a, 21c of the bus bars 20a, 20c on both sides among the three bus bars 20 are provided at the same position in the extending direction of the bus bars (Y direction). Further, the notch 21b of the bus bar 20b in the middle is provided at the position that is different from the positions of the notches 21a, 21c of the bus bars 20a, 20c on both sides. Each of the sensing elements 34 is arranged inside the notch 21 of its corresponding bus bar 20. According to such a configuration, similarly, the magnetic fields generated by the currents flowing in the narrow portions of the bus bars 20a, 20c do not impose serious influence on the sensing element 34b arranged in the notch 21b of the bus bar 20b. Similarly, the magnetic field generated by the current flowing in the narrow portion of the bus bar 2b does not impose serious influence on the sensing elements 34a, 34c arranged in the notches 21a, 21c of the bus bars 20a, 20c.

The shield unit 54 will be described with reference to FIG. 14. As shown in FIG. 14, the shield unit 54 molds an entire periphery of a lower shield plate 42 by insulative resin. The insulative resin covering the periphery of the lower shield plate 42 will be termed a resin package 41. The shield unit 54 has the same shape as the sensor unit 53. Slits arranged similar to those of the sensor unit 53 are provided in the shield unit 54 as well, and the shield unit 54 fits with the notches 22a, 22b, 22c on the lower sides of the bus bars 20, similarly to the sensor unit 53. Due to the shield unit 54, the sensing elements 34 can be shielded from a magnetic field that becomes noise generated outside the shield unit 54. That is, with the sensing elements 34 being sandwiched from above and under by the upper shield plate 32 of the sensor unit 53 and the lower shield plate 42 of the shield unit 54, the sensing elements 34 can be shielded from the magnetic fields that become noises generated above and under the current sensor 102.

As shown in FIG. 14, the narrow portion WN of the bus bar 20c and the sensing element 34c are sandwiched by the pair of shield plates (the upper shield plate 32 and the lower shield plate 42). The narrow portion WN of the bus bar 20c is located between the sensing element 34c and the lower shield plate 42, and the sensing element 34c is located closer to the upper shield plate 32 than to the lower shield plate 42. Further, as clearly shown in FIG. 14, a thickness of the upper shield plate 32 closer to the sensing element 34c is larger than a thickness of the lower shield plate 42. Due to this difference in the thicknesses, the same advantageous effect as the current sensor 2 explained in FIGS. 1 to 10 can be achieved. In the current sensor 102, the thicknesses of the pair of shield plates (the upper shield plate 32 and the lower shield plate 42) may be set equal, and materials of the respective shield plates may be selected to satisfy the relationship: "magnetic permeability of the upper shield plate 32>magnetic permeability of the lower shield plate 42". Further, the pair of shield plates (the upper shield plate 32 and the lower shield plate 42) may be selected to satisfy both relationships of: "thickness of the upper shield plate 32>thickness of the lower shield plate 42" and "magnetic permeability of the upper shield plate 32>magnetic permeability of the lower shield plate 42".

The same applies to the sensing element(s) 34a(34b). That is, the narrow portion(s) of the bus bar(s) 20a(20b) and the sensing element(s) 34a(34b) are sandwiched by the pair of shield plates (the upper shield plate 32 and the lower shield plate 42). The narrow portion(s) of the bus bar(s) 20a(20b) are located between the sensing element(s) 34a(34b) and the lower shield plate 42, and the sensing element(s) 34a(34b) are located closer to the upper shield plate 32 than to the lower shield plate 42. Further, the thickness of the upper shield plate 32 closer to the sensing element(s) 34a(34b) is larger than the thickness of the lower shield plate 42. The same advantageous effect as the sensing element 34c can be achieved for the sensing elements 34a, 34b as well.

Points to note for some features regarding the technique described in the embodiments will be mentioned. In the embodiments, the bus bar 3 is regarded as the measurement target conductor, and the bus bar 13 as the noise source. In focusing on the sensing element 14, the bus bar 13 becomes the measurement target conductor, and the bus bar 3 becomes the noise source. In this case as well, what has been described above is applied. The same applies to the embodiment of FIGS. 11 to 14.

The technique disclosed herein may be applied to a current sensor in which a magnetoelectric transducer is arranged for each of a plurality of conductors extending in parallel. In focusing on one conductor and a magnetoelectric transducer corresponding thereto, the remaining conductors correspond to the sources of the noise magnetic fields, and the presence of the remaining magnetoelectric transducers can be ignored. The technique disclosed herein may be applied even in cases where a number of the conductors is three or more.

In the description of the embodiments, the explanation is given as that "the magnetoelectric transducer measures the intensity of the magnetic field". Since the intensity of the magnetic field and the magnetic flux density are in a proportional relationship, it may be expressed as that "the magnetoelectric transducer measures the magnetic flux density of the magnetic field".

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

2: Current sensor 3, 13: Bus bar 4, 14: Sensing element 5: Lower shield plate 6: Upper shield plate 7: Sensor substrate 8: Resin package 20, 20a, 20b, 20c: Bus bar 21a, 21b, 21c, 22a, 22b, 22c: Notch 24: Bottom surface 31, 41: Resin package 32: Upper shield plate 33: Sensor substrate 34, 34a, 34b, 34c: Sensing element 38a: Notch 38b, 38c: Slit 39a, 39b, 39c: Fitting portion 42: Lower shield plate 53: Sensor unit 54: Shield unit 102: Current sensor

The invention claimed is:

1. A current sensor configured to measure a current flowing in one conductor of two conductors which are aligned in a first direction and extend in parallel in a second direction being orthogonal to the first direction, the current sensor comprising:
 a magnetoelectric transducer aligned with the one conductor in a third direction being orthogonal to the first direction and the second direction, and disposed such that a magnetism sensing direction of the magnetoelectric transducer is oriented in the first direction; and
 a pair of magnetism shield plates sandwiching the one conductor and the magnetoelectric transducer therebetween along the third direction,
 wherein
 the one conductor is located between the magnetoelectric transducer and one magnetism shield plate of the pair of magnetism shield plates,
 the magnetoelectric transducer is located closer to the other magnetism shield plate of the pair of magnetism shield plates than to the one magnetism shield plate, and at least one of a thickness and a magnetic permeability of the other magnetism shield plate is larger than corresponding one of a thickness and a magnetic permeability of the one magnetism shield plate.

2. The current sensor according to claim 1, wherein
the thickness of the one magnetism shield plate is equal to the thickness of the other magnetism shield plate, and
a product (Ml*Rl) of the magnetic permeability (Ml) of the one magnetism shield plate and a range (Rl) between the one magnetism shield plate and the magnetoelectric transducer is equal to a product (Mu*Ru) of the magnetic permeability (Mu) of the other magnetism shield plate and a range (Ru) between the other magnetism shield plate and the magnetoelectric transducer.

3. A current sensor configured to measure a current flowing in each of three conductors which supply electric power to a three-phase alternating-current motor, the three conductors aligned in a first direction and extending in parallel in a second direction being orthogonal to the first direction, the current sensor comprising:
three magnetoelectric transducers, each of the three magnetoelectric transducers provided for corresponding one of the three conductors, aligned with the corresponding one of the three conductors in a third direction being orthogonal to the first direction and the second direction, and disposed such that a magnetism sensing direction of each of the three magnetoelectric transducers is oriented in the first direction; and
a pair of magnetism shield plates sandwiching the three conductors and the three magnetoelectric transducers therebetween in the third direction,
wherein
the three conductors are located between the three magnetoelectric transducers and one magnetism shield plate of the pair of magnetism shield plates,
the three magnetoelectric transducers are located closer to the other magnetism shield plate of the pair of magnetism shield plates than to the one magnetism shield plate, and
at least one of a thickness and a magnetic permeability of the other magnetism shield plate is larger than corresponding one of a thickness and a magnetic permeability of the one magnetism shield plate.

4. The current sensor according to claim 3, wherein
a notch is provided in each of the three conductors,
the notches in the conductors at both sides are located at a same position in the second direction, and the notch in the conductor at the middle is located at a position in the second direction which is different from the position of the notches of the conductors at the both sides, and
each of the three magnetoelectric transducers is disposed inside the notch of the corresponding one of the three conductors.

* * * * *